US012218099B2

(12) United States Patent
Byun et al.

(10) Patent No.: US 12,218,099 B2
(45) Date of Patent: *Feb. 4, 2025

(54) INTERPOSER AND SEMICONDUCTOR PACKAGE INCLUDING THE SAME

(71) Applicant: SAMSUNG ELECTRONICS CO., LTD., Suwon-si (KR)

(72) Inventors: Jungsoo Byun, Suwon-si (KR); Taesung Jeong, Suwon-si (KR); Younggwan Ko, Suwon-si (KR); Jaeean Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 386 days.

This patent is subject to a terminal disclaimer.

(21) Appl. No.: 17/392,511

(22) Filed: Aug. 3, 2021

(65) Prior Publication Data

US 2021/0366878 A1    Nov. 25, 2021

Related U.S. Application Data

(63) Continuation of application No. 16/685,575, filed on Nov. 15, 2019, now Pat. No. 11,088,115.

(30) Foreign Application Priority Data

Dec. 6, 2018  (KR) .......................... 10-2018-0156194

(51) Int. Cl.
*H01L 25/065* (2023.01)
*H01L 23/00* (2006.01)
(Continued)

(52) U.S. Cl.
CPC ...... *H01L 25/0657* (2013.01); *H01L 23/3171* (2013.01); *H01L 23/49816* (2013.01);
(Continued)

(58) Field of Classification Search
CPC ............. H01L 25/0657; H01L 25/0652; H01L 25/0655; H01L 23/3171; H01L 23/525;
(Continued)

(56) References Cited

U.S. PATENT DOCUMENTS 4,967,950 A * 11/1990 Legg ....................... H01L 24/81
257/E21.511
6,348,728 B1   2/2002 Aiba et al.
(Continued)

FOREIGN PATENT DOCUMENTS

CN         1624919 A     6/2005
JP     2017-212416 A    11/2017
(Continued)

OTHER PUBLICATIONS

Communication issued on Jan. 10, 2023 by the Korean Patent Office in Corresponding Korean Patent Application No. 10-2018-0156194.
(Continued)

*Primary Examiner* — Dale E Page
*Assistant Examiner* — Quovaunda Jefferson
(74) *Attorney, Agent, or Firm* — Sughrue Mion, PLLC

(57) ABSTRACT

A semiconductor package includes an interposer, first and second semiconductor chips, and electrical connection structures. The interposer includes a first connection structure having a first redistribution conductor, second connection structures each having a second redistribution conductor, third connection structures each having a third redistribution conductor, and a passivation layer filling spaces between the first to third connection structures. The first semiconductor chip is disposed on the interposer to overlap the first connection structure and some third connection structures. The second semiconductor chip is disposed on the interposer to overlap some second connection structures and third connection structures. The electrical connection structures
(Continued)

are electrically connected to the first and second chips. The first redistribution conductor electrically connects the first chip to some electrical connection structures, the second redistribution conductor electrically connects the second chip to some electrical connection structures, and the third redistribution conductor electrically connects the first and second chips.

16 Claims, 15 Drawing Sheets

(51) Int. Cl.
*H01L 23/31* (2006.01)
*H01L 23/498* (2006.01)

(52) U.S. Cl.
CPC .. *H01L 23/49827* (2013.01); *H01L 23/49861* (2013.01); *H01L 24/05* (2013.01); *H01L 24/12* (2013.01); *H01L 2224/02372* (2013.01); *H01L 2224/13111* (2013.01)

(58) Field of Classification Search
CPC ............... H01L 23/528; H01L 23/485; H01L 23/49816; H01L 23/49827; H01L 23/49861; H01L 23/3128; H01L 23/5385; H01L 23/5383; H01L 23/49838; H01L 24/02; H01L 24/05; H01L 24/12; H01L 24/13; H01L 24/14; H01L 24/16; H01L 24/32; H01L 24/73; H01L 24/81; H01L 24/83; H01L 24/92; H01L 24/97; H01L 2224/02372; H01L 2224/13111; H01L 2224/0401; H01L 2224/13147; H01L 2224/16145; H01L 2224/16227; H01L 2224/32225; H01L 2224/73204; H01L 2224/81005; H01L 2224/83005; H01L 2224/92125; H01L 2224/02331; H01L 2224/02373; H01L 2225/06513; H01L 2225/06517; H01L 2924/15151; H01L 2924/15192; H01L 2924/15311; H01L 2924/15331; H01L 2924/18161; H01L 2924/3511; H01L 2924/3512; H01L 21/6835; H01L 21/568; H01L 2221/68345; H01L 2924/00014; H01L 2224/16225; H01L 2924/00
See application file for complete search history.

(56) References Cited

U.S. PATENT DOCUMENTS

| | | | |
|---|---|---|---|
| 8,559,185 B2 * | 10/2013 | Lee | H01L 24/16 |
| | | | 174/262 |
| 8,803,327 B2 * | 8/2014 | Oh | H01L 25/0655 |
| | | | 257/757 |
| 9,006,030 B1 * | 4/2015 | Kwon | H01L 23/3128 |
| | | | 438/126 |
| 9,337,120 B2 | 5/2016 | Li et al. | |
| 9,721,923 B1 * | 8/2017 | Shih | H01L 24/97 |
| 11,088,115 B2 * | 8/2021 | Byun | H01L 24/12 |
| 2002/0079572 A1 | 6/2002 | Khan et al. | |
| 2005/0121770 A1 | 6/2005 | Baek et al. | |
| 2010/0133704 A1 | 6/2010 | Marimuthu et al. | |
| 2011/0133324 A1 | 6/2011 | Fan et al. | |
| 2015/0259194 A1 | 9/2015 | Lin et al. | |
| 2016/0163609 A1 | 6/2016 | Rahman et al. | |
| 2017/0207205 A1 | 7/2017 | Kim et al. | |
| 2017/0323866 A1 | 11/2017 | Shih | |
| 2017/0365558 A1 | 12/2017 | Oh et al. | |
| 2017/0365566 A1 | 12/2017 | Lee et al. | |
| 2017/0365567 A1 | 12/2017 | Kim et al. | |
| 2018/0096940 A1 | 4/2018 | Kim et al. | |
| 2018/0138083 A1 | 5/2018 | Kim et al. | |

FOREIGN PATENT DOCUMENTS

| | | |
|---|---|---|
| KR | 10-1538539 B1 | 7/2015 |
| KR | 10-2017-0142712 A | 12/2017 |
| KR | 10-2018-0091307 A | 8/2018 |
| TW | 201803045 A | 1/2018 |

OTHER PUBLICATIONS

Communication dated Sep. 28, 2023, issued by the Chinese Patent Office in counterpart Chinese Application No. 201911217424.2.
Communication dated Jul. 20, 2023 issued by the Korean Intellectual Property Office in counterpart Korean Application No. 10-2018-0156194.
Communication issued on May 14, 2024 by the Chinese Patent Office in corresponding CN Patent Application No. 201911217424.2.

* cited by examiner

INTERPOSER AND SEMICONDUCTOR PACKAGE INCLUDING THE SAME

CROSS-REFERENCE TO RELATED APPLICATION

This application is a continuation application of U.S. application Ser. No. 16/685,575, filed Nov. 15, 2019, which claims benefit of priority to Korean Patent Application No. 10-2018-0156194 filed on Dec. 6, 2018 in the Korean Intellectual Property Office, the disclosure of which is incorporated herein by reference in its entirety.

BACKGROUND

The present disclosure relates to an interposer and semiconductor package including the same.

The interposer market is growing due to high quality requirements for the set of product and the adoption of High Bandwidth Memory (HBM). Recently, silicon has mainly been used as a material of the interposer. For example, in the case of a semiconductor package using an interposer, a die may be surface-mounted on a silicon-based interposer, and the interposer may then be molded with a molding material to prepare the semiconductor package.

In the meantime, as quality requirements of the set have increased recently, the size of the interposer is becoming larger due to an increase in the number of HBMs, comparing to the conventional product. Therefore, there is emerging a high risk that process difficulty will increase and yield therefrom will decrease.

SUMMARY

An aspect of the present disclosure is to provide a semiconductor package capable of lowering process difficulty, increasing efficiency and yield in process, and solving a warpage or a misalignment problem, while still providing an interposer having a relatively large area.

According to an aspect of the present disclosure, a plurality of connection structures is prepared by separating redistribution regions having different process difficulties, the plurality of connection structures are disposed in parallel in a single passivation layer to form an interposer, and a plurality of semiconductor chips are disposed on and electrically connected to the interposer.

According to an aspect of the present disclosure, a semiconductor package includes an interposer including a plurality of connection structures disposed to be spaced apart from each other, and each including a respective insulation layer and a respective plurality of redistribution layers disposed in or on the respective insulation layer and electrically connected to each other, the redistribution layers of different connection structures of the plurality of connection structures being parallel to each other. The interposer further includes a passivation layer covering at least a portion of each of the plurality of connection structures and filling at least a portion of a space between the plurality of connection structures. A first semiconductor chip is disposed on the interposer and has a plurality of first connection pads, and a second semiconductor chip is disposed adjacent to the first semiconductor chip on the interposer and has a plurality of second connection pads. The plurality of connection structures are independently disposed to each at least partially overlap with at least one of the first and second semiconductor chips, in a stacking direction of the first and second semiconductor chips on the interposer. The plurality of redistribution layers of each of the plurality of connection structures are electrically connected to at least one of the pluralities of first and second connection pads, and the insulation layers and the passivation layer include different materials.

According to another aspect of the present disclosure, a semiconductor package includes an interposer including a plurality of connection structures disposed to be spaced apart from each other, and each including a plurality of respective redistribution layers electrically connected to each other, the redistribution layers of different connection structures of the plurality of connection structures being parallel to each other. The interposer further includes a passivation layer covering at least a portion of each of the plurality of connection structures and filling at least a portion between the plurality of connection structures, and a plurality of under bump metals each including a metal pad disposed on the passivation layer and a metal via passing through the passivation layer and electrically connecting the metal pad and a redistribution layer of the plurality of redistribution layers. A first semiconductor chip is disposed on the interposer and has a plurality of first connection pads, and a second semiconductor chip is disposed adjacent to the first semiconductor chip on the interposer and has a plurality of second connection pads. The plurality of connection structures are disposed to each at least partially overlap with at least one of the first and second semiconductor chips, in a stacking direction of the first semiconductor chip on the interposer. The plurality of redistribution layers of each of the plurality of connection structures are electrically connected to at least one of the plurality of first and second connection pads via the plurality of under bump metals.

According to a further aspect of the present disclosure, an interposer for connecting and redistributing a plurality of connection pads of one or more semiconductor chips mounted on an upper surface thereof to connection structures exposed through a lower surface thereof includes a plurality of connection structures disposed to be spaced apart from each other, each including a respective insulation layer and a respective plurality of redistribution layers disposed in or on the respective insulation layer and electrically connected to each other, the redistribution layers of different connection structures of the plurality of connection structures being parallel to each other in the interposer. The interposer further includes a passivation layer having the plurality of connection structures embedded therein, the passivation layer extending over upper surfaces of each of the plurality of connection structures, and the passivation layer having lower surfaces of each of the plurality of connection structures exposed through a lower surface thereof.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
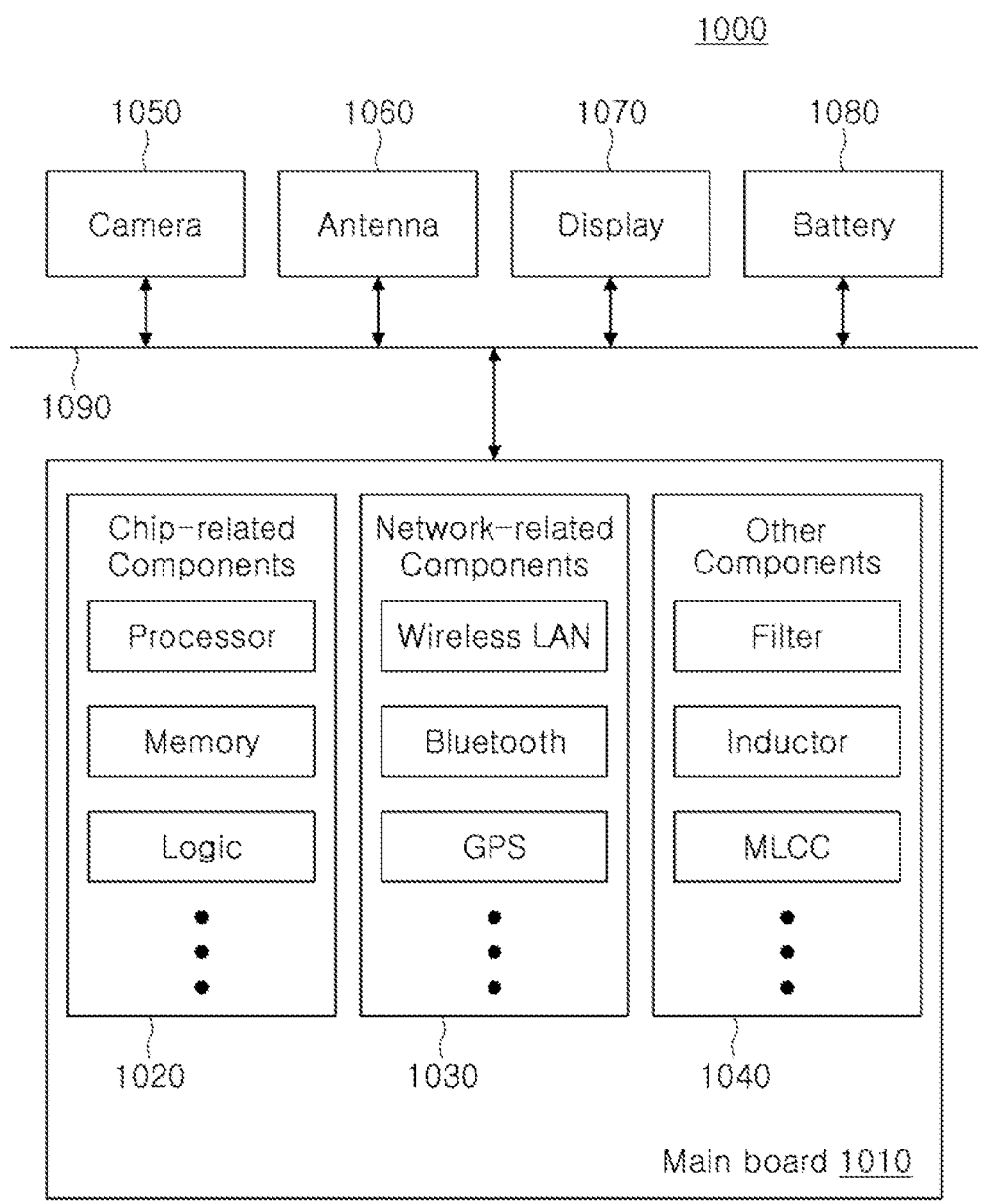
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below by various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter(ADC), an application-specific integrated circuit (ASIC), or the like. However, the chip related components 1020 are not limited thereto, but may also include other types of chip related components. In addition, the chip related components 1020 may be combined with each other.

The network related components 1030 may include components operating according to protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include components operating according to a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
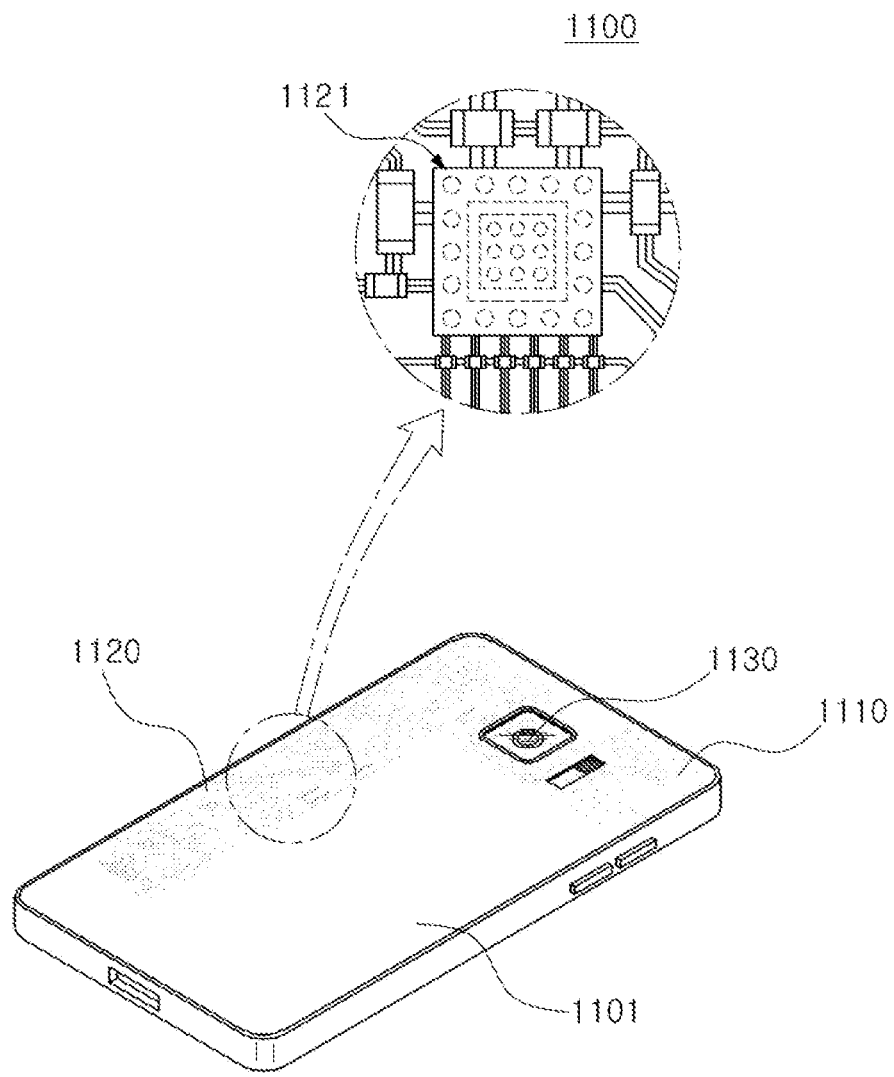
FIG. 2 is a schematic perspective view illustrating an example of an electronic device.

FIG. 2 is a schematic perspective view illustrating an example of an electronic device.

Referring to the drawings, a semiconductor package including an organic interposer may be used for various purposes in the various electronic devices as described above. For example, a motherboard 1110 may be accommodated in a body 1101 of a smartphone 1100, and various electronic components 1120 may be physically and/or electrically connected to the motherboard 1110. In addition, other components that may or may not be physically or electrically connected to the motherboard 1110, such as a camera 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Semiconductor packaging is commonly used to compensate for a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is advantageously employed.

Hereinafter, the use of an interposer in a semiconductor package manufactured by such a packaging technique will be described in more detail with reference to the drawings.

Figure 3:
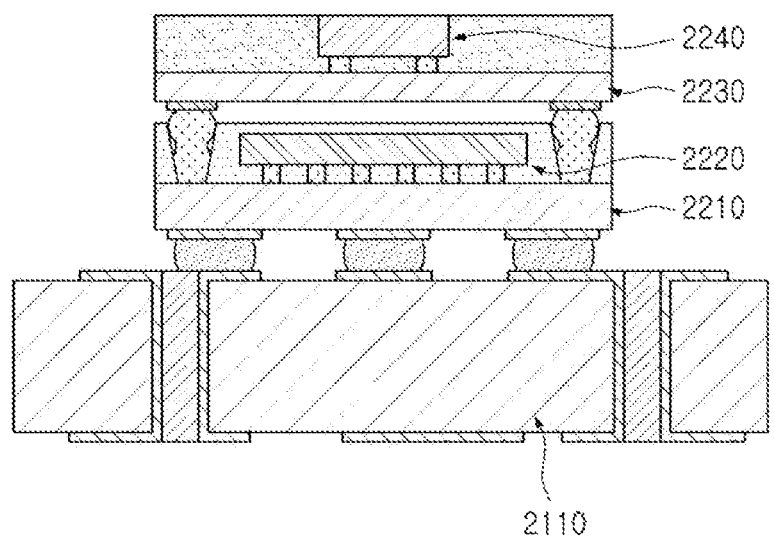
FIG. 3 is a schematic cross-sectional view illustrating a 3D ball grid array (BGA) package mounted on a main board of an electronic device.

FIG. 3 is a schematic cross-sectional view illustrating a case in which a 3D ball grid array (BGA) package is mounted on a main board of an electronic device.

Since application specific integrated circuits (ASICs) such as graphics processing units (GPUs) in semiconductor chips may be very expensive, it may be very important to carry out packaging at a relatively high yield. For this purpose, a ball grid array (BGA) substrate 2210 or the like capable of redistributing thousands to millions of connection pads may be prepared before a semiconductor chip is mounted. Next, a semiconductor chip such as an expensive semiconductor chip, for example, a GPU 2220, or the like, may be subsequently mounted and packaged on a BGA substrate 2210 by a surface mounting technology (SMT) or the like, and may be then finally mounted on a main board 2110.

Meanwhile, the GPU 2220 may need to minimize a signal path to a memory such as a high bandwidth memory (HBM). To this end, a semiconductor chip such as HBM 2240 may be mounted on an interposer 2230 and packaged, and may be then used by stacking the same on a package on which the GPU 2220 is mounted, in the form of a package on package (POP). In this case, there may be problems that a thickness of the device becomes too thick, and a signal path is also limited to be minimized.

Figure 4:
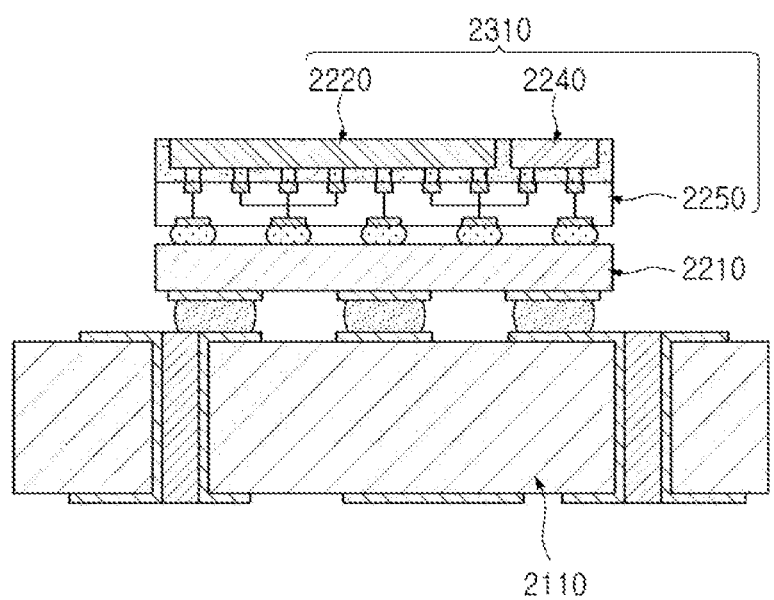
FIG. 4 is a schematic cross-sectional view illustrating a 2.5D silicon interposer package mounted on a main board.

FIG. 4 is a schematic cross-sectional view illustrating a case in which a 2.5D silicon interposer package is mounted on a main board.

As one of proposals for solving the above-described problems, it may be considered to manufacture a semiconductor package 2310 including a silicon interposer using a 2.5D interposer technology that a first semiconductor chip such as a GPU 2220 and a second semiconductor chip such as an HBM 2240 may be surface-mounted and packaged on a silicon interposer 2250 in parallel. In this case, the GPU 2220 and the HBM 2240 having thousands to millions of connection pads may be redistributed through the interposer 2250, and may be electrically connected to each other via a minimum path. The semiconductor package 2310 including such a silicon interposer is again mounted and redistributed on a BGA substrate 2210 or the like, to finally mount the semiconductor package on the main board 2110. In the case of the silicon interposer 2250, since formation of a through silicon via (TSV) may be very difficult, and manufacturing costs thereof may be also considerable, it may be disadvantageous for increasing an area and lowering manufacturing costs of the semiconductor package.

Figure 5:
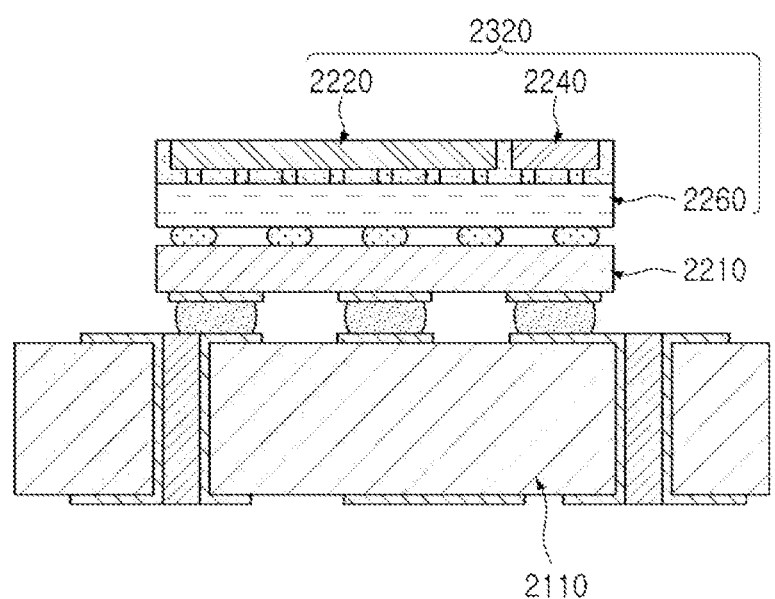
FIG. 5 is a schematic cross-sectional view illustrating a 2.5D organic interposer package mounted on a main board.

FIG. 5 is a schematic cross-sectional view illustrating a case in which a 2.5D organic interposer package is mounted on a main board.

As one of proposals for solving the above-described problems, it may be considered to use an organic interposer 2260 instead of the silicon interposer 2250. For example, it may be considered to manufacture a semiconductor package 2320 including the organic interposer using a 2.5D interposer technique in which a first semiconductor chip, such as a GPU 2220, and a second semiconductor chip, such as an HBM 2240, may be surface-mounted and packaged on the organic interposer 2260 in parallel. In this case, the GPU 2220 and the HBM 2240 having thousands to millions of connection pads may be redistributed through the interposer 2260, and may be electrically connected to each other via a minimum path. The semiconductor package 2320 including such an organic interposer is again mounted and redistributed on a BGA substrate 2210 or the like, to finally mount the semiconductor package on the main board 2110. Further, it may be advantageous for increasing an area and lowering manufacturing costs of the semiconductor package. When a molding process is performed on the semiconductor package 2320 including the organic interposer, due to mismatch in coefficient of thermal expansion (CTE) between molding materials of the interposer 2260 and the chips 2220 and 2240, and the like, there may be problems such as occurrence of warpage, poor filling of an underfill resin, occurrence of cracking between a die and a molding material, and the like. Further, in the case of the organic interposer, it may be disadvantageous for realizing a fine pattern thereon.

As one of proposals for solving the above-described problems, although it is not illustrated in detail in the drawings, it may be considered that a silicon-based interconnection bridge having a fine pattern is separately formed and inserted into a cavity of a BGA substrate. In this case, it may be difficult to form the cavity and corresponding microcircuits in the BGA substrate, which may cause a problem regarding process and yield reduction. Therefore, there may be a demand for a new type of semiconductor package capable of solving all these problems.

Figure 6:
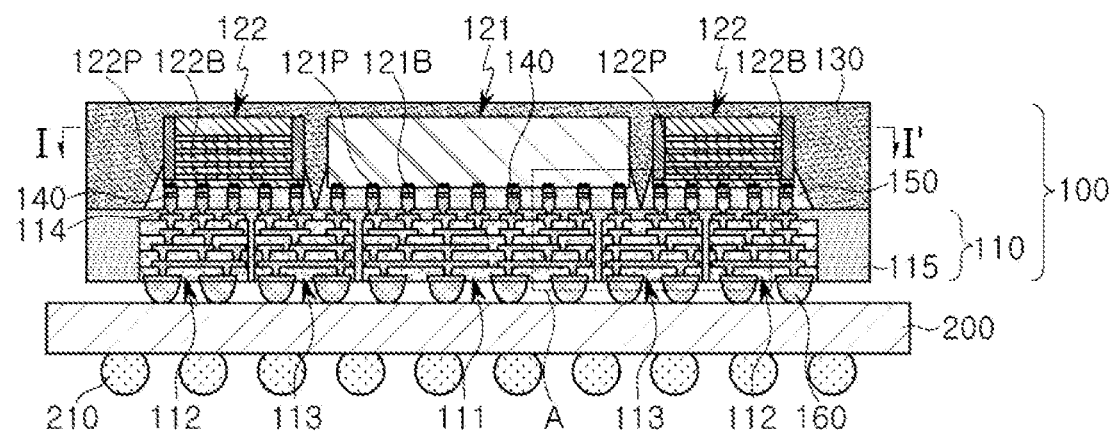
FIG. 6 is a schematic cross-sectional view illustrating an example of a semiconductor package in accordance with the principles of the disclosure.

FIG. 6 is a schematic cross-sectional view illustrating an example of a semiconductor package.

Figure 7:
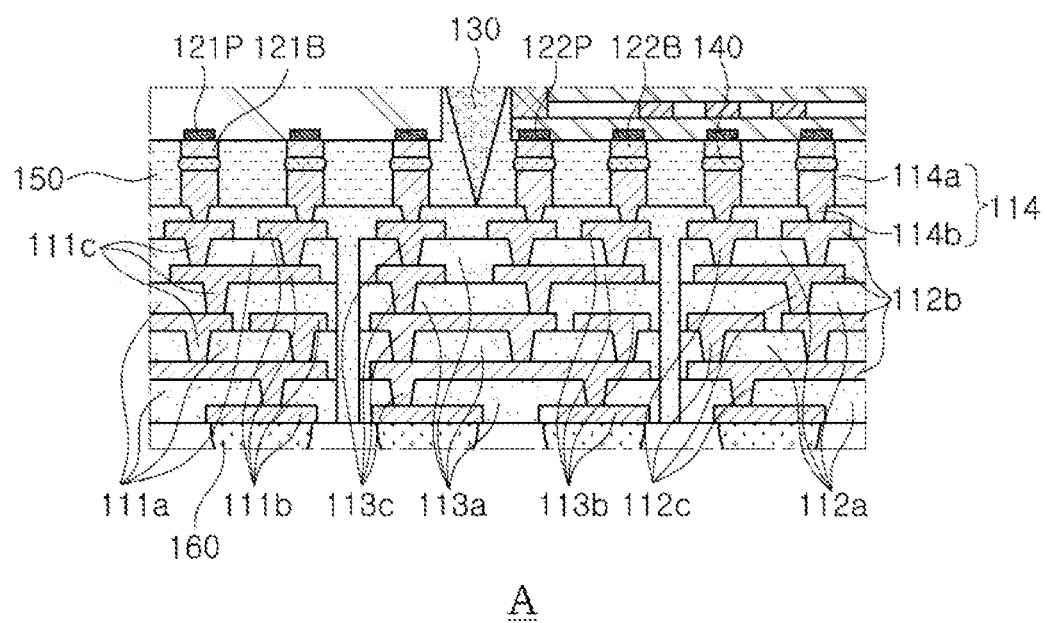
FIG. 7 is a schematic enlarged cross-sectional view illustrating region A of the semiconductor package of FIG. 6.

FIG. 7 is a schematic enlarged cross-sectional view illustrating region A of the semiconductor package of FIG. 6.

Figure 8:
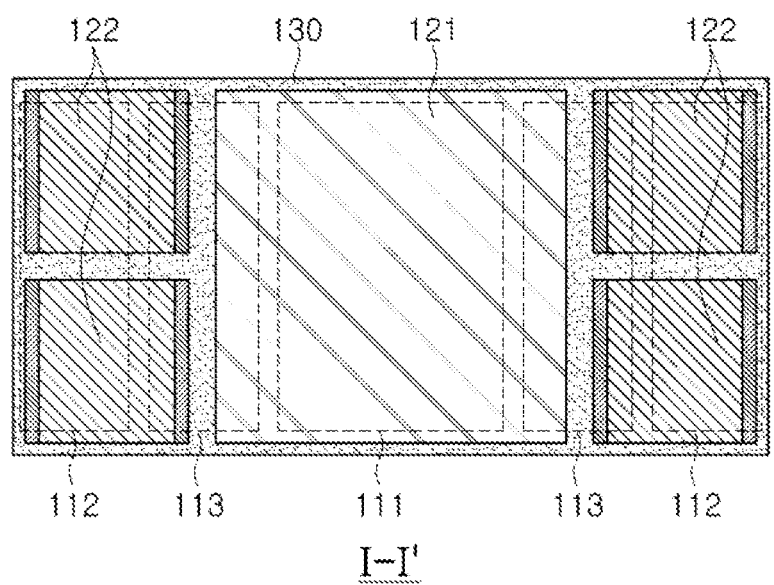
FIG. 8 is a cross-sectional view of the semiconductor package taken along line I-I' of FIG. 6.

FIG. 8 is a schematic cross-sectional view illustrating the semiconductor package taken along line I-I' of FIG. 6.

Referring to the drawings, a semiconductor package 100 according to an example may include an interposer 110, a first semiconductor chip 121 disposed on the interposer 110 and having a plurality of first connection pads 121P, and a second semiconductor chip 122 disposed around the first semiconductor chip 121 on the interposer 110 and having a plurality of second connection pads 122P. In this case, the interposer 110 may include a plurality of connection structures 111, 112, and 113, disposed to be spaced apart from and parallel to each other, and including respective insulation layers 111a, 112a, and 113a and a plurality of respective redistribution layers 111b, 112b, and 113b disposed in or on the insulation layers 111a, 112a, and 113a and electrically connected to each other, and the redistribution layers 111b, 112b, and 113b may be parallel to each other, and a passivation layer 115 covering at least a portion of each of the plurality of connection structures 111, 112, and 113 and filling at least a portion between the plurality of connection structures 111, 112, and 113. The plurality of connection structures 111, 112, and 113 may be independently arranged to each at least partially overlap at least one of the first and second semiconductor chips 121 and 122, in plan view. The plurality of redistribution layers 111b, 112b, and 113b of each of the plurality of connection structures 111, 112, and 113 may be electrically connected to at least one of the plurality of first and second connection pads 121P and 122P. Overlapping in plan view refers to there being a region overlapping each other between components arranged on different levels, when the semiconductor package 100 is viewed from an upper or lower position thereof, for example, when viewed according to the view illustrated in FIG. 8, and the like.

As described above, as the high quality requirements of the set increase recently, the size of the interposer is becoming larger as a result of an increase in the number of HBMs, in comparison to the conventional product. Therefore, there is emerging a high risk that process difficulty increases and yield therefrom decreases. For example, when the number of HBMs employed increases from four (4) to eight (8), an area of the package will be approximately 2.5 times larger than the previous one, and thus an area used for a fine redistribution layer (Fine RDL) will also be two (2) times or more. As the area of the fine redistribution layer increases, the process difficulty of manufacturing the layer may increase. As a result, defects related to foreign matters and systematization may also increase proportionally. This may result in lowering competitiveness of the product due to the process cost.

A semiconductor package 100 according to an example may have a configuration by preparing separately regions, different in the process difficulty, for example, a region of the first redistribution layer 111b of the first connection structure 111 for redistributing the first semiconductor chip 121, a region of the second redistribution layer 112b of the second connection structure 112 for redistributing the second semiconductor chip 122, and a region of the third redistribution layer 113b of the third connection structure 113 for electrically connecting the first and second semiconductor chips 121 and 122, respectively, to conform their process abilities. In turn, only good components from the prepared first to third connection structures 111, 112, and 113 may be selected through electrical inspection to separate them from each other by a singulation process in a unit. Next, the selected connection structures may be arranged to correspond to the positions of the first and second semiconductor chips 121 and 122, and the interposer 110 may thereby be prepared in a manner in which a passivation layer 115 covers the first to third connection structures 111, 112, and 113. Finally, the first and second semiconductor chips 121 and 122 may be surface-mounted on the interposer 110.

Since the first to third connection structures 111, 112, and 113 may be prepared by separating a region having a high degree of process difficulty and a region having a low degree of process difficulty, process difficulty may be relatively reduced, yield improvement may be facilitated, and efficiency in a process and space utilization in a panel may be maximized. In addition, since the separate first to third connection structures 111, 112, and 113 may be integrated together in the carrier, handling issues due to warpage may also be improved in comparison to a structure in which multiple redistribution layers are continuously formed over a relatively large area, such as a conventional silicon interposer or an organic interposer.

In a semiconductor package 100 according to an example, the insulation layers 111a, 112a, and 113a of the plurality of connection structures 111, 112, and 113 may include a material different from that of the passivation layer 115. For example, each of the insulation layers 111a, 112a, and 113a and the passivation layer 115 may be a photosensitive insulation layer including a photo-imageable dielectric (PID). Each of the insulation layers 111a, 112a, and 113a may be a positive-type photosensitive insulation layer formed in a liquid type. The passivation layer 115 may be a negative-type photosensitive insulation layer formed in a film type. When the insulation layers 111a, 112a, and 113a of the plurality of connection structures 111, 112, and 113 are the positive-type photosensitive insulation layer formed in the liquid type, the redistribution layers 111b, 112b, and 113b, and connection vias 111c, 112c, and 113c may be finely designed in a fine shape. At the same time, when the passivation layer 115 is the negative-type photosensitive insulation layer formed in the film type, an effect for controlling warpage may be enhanced. In addition, by effectively filling space between the plurality of connection structures 111, 112, and 113, the void problem may be prevented and the thickness deviation may be also reduced.

A semiconductor package 100 according to an example may further include a plurality of under bump metals 114 respectively including a metal pad 114a disposed on the passivation layer 115 and a metal via 114b passing through the passivation layer 115 and electrically connecting the metal pad 114a and the plurality of redistribution layers 111b, 112b, and 113b. The plurality of under bump metals 114 may compensate for misalignment between the plurality of redistribution layers 111b, 112b, and 113b, and the plurality of first and second connection pads 121P and 122P, which may occur during embedment of the plurality of connection structures 111, 112, and 113, and may electrically connect them. Accordingly, although the plurality of connection structures 111, 112, and 113 are separately manufactured, and then embedded and disposed in the interposer 110 as described above, the misalignment may be effectively solved.

The plurality of under bump metals 114 may be electrically connected to the plurality of first and second connection pads 121P and 122P through a plurality of connection members 140. The plurality of connection members 140 may include a low melting metal selected from the group consisting of tin (Sn), and alloys containing tin (Sn), respectively, and, may be, for example a solder bump. The first and second semiconductor chips 121 and 122 may be surface-mounted on the interposer 110 using the plurality of under bump metals 114 and the plurality of connection members 140. In this case, the first and second semiconductor chips 121 and 122 may be fixed to the underfill resin 150 disposed on the interposer 110, respectively. The underfill resin 150 may cover at least a portion of each of the plurality of under bump metals 114 and the plurality of connection members 140 between the first and second semiconductor chips 121 and 122 and the interposer 110, and may also cover at least a portion of each of a plurality of first and second metal bumps 121B and 122B which may be respectively disposed on the first and second connection pads 121P and 122P described later.

A semiconductor package 100 according to an example may further include an encapsulant 130 disposed on the interposer 110 and covering at least a portion of each of the first and second semiconductor chips 121 and 122 and the underfill resin 150. The encapsulant 130 may protect and further fix the first and second semiconductor chips 121 and 122 at the same time. A back surface of each of the first and second semiconductor chips 121 and 122 and a back surface of the encapsulant 130 may optionally be coplanar through a grinding process. When the back surfaces of the semiconductor chips 121 and 122 are exposed, the heat radiation effect may be improved. Here, it can be understood that the coplanar refers not only to a form of complete coplanariry, but also to consider a rough coplanarity, for example, considering a minute thickness deviation occurring in the process, and the like. Hereinafter, term "coplanar" is applied in a similar manner as described above.

In a semiconductor package 100 according to an example, a plurality of connection structures 111, 112, and 113 may have substantially the same thickness as each other. The plurality of connection structures 111, 112, and 113 may include the same number of redistribution layers 111b, 112b, and 113b. In this case, when the plurality of connection structures 111, 112, and 113 are covered with a passivation layer 115, a substantially flat surface may be provided. Therefore, first and second semiconductor chips 121 and 122 may be easily mounted and arranged. Herein, it can be understood that the term "substantially" refers not only to the complete/exact same, but also to approximately the same, for example, considering a minute thickness deviation occurring in the process. Hereinafter, term "substantially" is applied in a similar manner as described above.

In a semiconductor package 100 according to an example, a surface opposite to a surface of the insulation layers 111a, 112a, and 113a of each of the plurality of connection structures 111, 112, and 113, facing the first and second semiconductor chips 121 and 122, may be coplanar with a surface opposite to a surface of the passivation layer 115, facing the first and second semiconductor chips 121 and 122, for example, lower surfaces thereof in the drawing may be coplanar. In this case, a plurality of connection structures 111, 112, and 113 having substantially the same thickness may be disposed on the same level as each other on the carrier, such that a substantially flat surface may be provided, when the plurality of connection structures 111, 112, and 113 may be covered with the passivation layer 115. In addition, after the carrier is removed, a first electrical connection metal 160 for connecting to a printed circuit board 200 and the like may be manufactured on the same level. Therefore, the semiconductor package 100 may be easily mounted on the printed circuit board 200 and the like.

Hereinafter, each configuration included in a semiconductor package 100 according to one example will be described in detail with reference to the drawings.

An interposer 110 may redistribute first and second connection pads 121P and 122P of first and second semiconductor chips 121 and 122, and may electrically connect the first and second connection pads 121P and 122P to each other. Several tens to millions of the first and second connection pads 121P and 122P having various functions may be redistributed through the interposer 110, and may be physically and/or electrically connected to other components, in accordance with functions thereof. The interposer 110 may include a plurality of connection structures 111, 112, and 113, and a passivation layer 115 covering at least a portion of each of the plurality of connection structures 111, 112, and 113 and filling at least a portion between the plurality of connection structures 111, 112, and 113, and, preferably, may further include a plurality of under bump metals 114 respectively including a metal pad 114a disposed on the passivation layer 115 and a metal via 114b passing through the passivation layer 115 and electrically connecting the metal pad 114a and the plurality of redistribution layers 111b, 112b, and 113b.

The plurality of connection structures 111, 112, and 113 may include first to third connection structures 111, 112, and 113. The first connection structure 111 may be disposed such that at least a portion thereof overlaps the first semiconductor chip 121, in plan view, the second connection structure 112 may be disposed such that at least a portion thereof overlaps the second semiconductor chip 122, in plan view, and the third connection structure 113 may be disposed such that at least a portion thereof respectively overlaps the first and second semiconductor chips 121 and 122, in plan view. Optionally, the number of each of the first to third connection structures 111, 112, and 113 may be greater than that illustrated in the drawing. The plurality of connection structures 111, 112, and 113 may have substantially the same thickness as each other. For example, the plurality of connection structures 111, 112, and 113 may include the same number of redistribution layers 111b, 112b, and 113b as each other. In this case, when the plurality of connection structures 111, 112, and 113 are covered with the passivation layer 115, a substantially flat surface may be provided. Therefore, the first and second semiconductor chips 121 and 122 may be easily mounted and arranged.

The first connection structure 111 may serve to redistribute the first connection pad 121P of the first semiconductor chip 121. The first connection structure 111 may include a first insulation layer 111a, a plurality of first redistribution layers 111b disposed on or in the first insulation layer 111a, and a plurality of first connection vias 111c disposed in the first insulation layer 111a and electrically connecting the plurality of first redistribution layers 111b to each other. The number of layers of the first insulation layer 111a and of the first redistribution layer 111b, and the number of vias of the first connection via 111c, are not particularly limited, and may vary depending on the design.

As the material of the first insulation layer 111a, an insulating material may be used. As the insulating material, a photosensitive insulating material such as PID may be used. For example, the first insulation layer 111a may be a photosensitive insulation layer. When the first insulation layer 111a has photosensitive property, the first insulation layer 111a may be formed to be relatively thinner, and the first insulation layer 111a may more easily achieve the fine pitch of the first redistribution layer 111b and the first connection via 111c. The first insulation layer 111a may be a positive-type photosensitive insulation layer formed in a liquid type as described above. The first connection structure 111 may be an organic block including an organic material. The first insulation layer 111a may have a multilayer structure. The first insulation layer 111a may be seen as a multilayer structure in which boundaries of the respective layers may be distinct, and may be seen as one layer in which boundaries of the respective layers may be unclear. A lowermost surface of the first insulation layer 111a may be coplanar with a lowermost surface of the passivation layer 115.

The first redistribution layer(s) 111b may function to redistribute the first connection pad 121P, and, as a material for formation thereof, a metal material such as copper (Cu), aluminum (Al), silver (Ag), tin (Sn), gold (Au), nickel (Ni), lead (Pb), titanium (Ti), or alloys thereof may be used. The first redistribution layer(s) 111b may perform various functions, depending on a desired design. For example, a ground pattern, a power pattern, a signal pattern, and the like may be included. The ground pattern and the power pattern may be the same pattern. The signal pattern may include various signal patterns except for a ground pattern, a power pattern, and the like, for example, a data signal pattern. A variety of connection via pads, electrical connection metal pads, and the like may be also included. The lowermost surface of the first redistribution layer(s) 111b may be exposed from the lowermost surface of the first insulation layer 111a, and may be used as a pad for connection with the first electrical connection metal 160. A surface treatment layer (not illustrated) may be formed on the surface of the pad pattern for the first electrical connection metal 160 on the lowermost surface of the first redistribution layer 111*b*, and the surface treatment layer may be plated with nickel (Ni)/gold (Au) or the like.

The first connection via(s) 111*c* may electrically connect the first redistribution layers 111*b* disposed on different layers, thereby forming an electrical path. As the material for forming the first connection via(s) 111*c*, a metal material, such as copper (Cu), aluminum (Al), silver (Ag), tin (Sn), gold (Au), nickel (Ni), lead (Pb), titanium (Ti), or alloys thereof may be used. Each first connection via 111*c* may be a filled type via filled with a metal material, or may be a conformal type via in which a metal material is formed along a wall surface of a via hole. Further, it may have a tapered shape in which a width of an upper surface thereof is wider than a width of a lower surface thereof. The first connection via(s) 111*c* may have a signal via, a ground via, a power via, etc., and the ground via and power via may be the same vias.

The second connection structure 112 may function to redistribute the second connection pad 122P of the second semiconductor chip 122. The second connection structure 112 may be disposed in a one-to-many relationship with the second semiconductor chip 122 for convenience of alignment. For example, one second connection structure 112 may be disposed corresponding to the two second semiconductor chips 122. The second connection structure 112 may include a second insulation layer 112*a*, a plurality of second redistribution layers 112*b* disposed on or in the second insulation layer 112*a*, and a plurality of second connection vias 112*c* disposed in the second insulation layer 112*a* and electrically connecting the plurality of second redistribution layers 112*b* to each other. The second insulation layer 112*a* may have a multilayer structure. The number of layers of the second insulation layer 112*a* and of the second redistribution layer 112*b*, and the number of vias of the second connection via 112*c*, are not particularly limited, and may vary depending on the design.

As the material of the second insulation layer 112*a*, an insulating material may be used. As the insulating material, a photosensitive insulating material such as PID may be used. For example, the second insulation layer 112*a* may be a photosensitive insulation layer. When the second insulation layer 112*a* has photosensitive property, the second insulation layer 112*a* may be formed to be relatively thinner, and the second insulation layer 112*a* more easily achieve the fine pitch of the second redistribution layer 112*b* and the second connection via 112*c*. The second insulation layer 112*a* may be a positive-type photosensitive insulation layer formed in a liquid type as described above. The second connection structure 112 may be an organic block including an organic material. The second insulation layer 112*a* may be seen as a multilayer structure in which boundaries of the respective layers may be distinct, and may be seen as one layer in which boundaries of the respective layers may be unclear. A lowermost surface of the second insulation layer 112*a* may be coplanar with a lowermost surface of the passivation layer 115.

The second redistribution layer 112*b* may function to redistribute the second connection pad 122P, and, as a material for formation thereof, a metal material such as copper (Cu), aluminum (Al), silver (Ag), tin (Sn), gold (Au), nickel (Ni), lead (Pb), titanium (Ti), or alloys thereof may be used. The second redistribution layer 112*b* may perform various functions, depending on a desired design. For example, a ground pattern, a power pattern, a signal pattern, and the like may be included. The ground pattern and the power pattern may be the same pattern. The signal pattern may include various signal patterns except for a ground pattern, a power pattern, and the like, for example, a data signal pattern. A variety of connection via pads, electrical connection metal pads, and the like may be also included. The lowermost surface of the second redistribution layer 112*b* may be exposed from the lowermost surface of the second insulation layer 112*a*, and may be used as a pad for connection with the first electrical connection metal. A surface treatment layer (not illustrated) may be formed on the surface of the pad pattern for the first electrical connection metal 160 on the lowermost surface of the second redistribution layer 112*b*, and the surface treatment layer (not illustrated) may be plated with nickel (Ni)/gold (Au) or the like.

The second connection via 112*c* may electrically connect the second redistribution layers 112*b* disposed in different layers, thereby forming an electrical path. As the material for forming the second connection via 112*c*, a metal material, such as copper (Cu), aluminum (Al), silver (Ag), tin (Sn), gold (Au), nickel (Ni), lead (Pb), titanium (Ti), or alloys thereof may be used. The second connection via 112*c* may be a filled type via filled with a metal material, or may be a conformal type via in which a metal material is formed along a wall surface of a via hole. Further, it may have a tapered shape in which a width of an upper surface thereof is wider than a width of a lower surface thereof. The second connection via 112*c* may have a signal via, a ground via, a power via, etc., and the ground via and power via may be the same vias.

The third connection structure 113 may function to electrically connect the first and second connection pads 121P and 122P of the first and second semiconductor chips 121 and 122 to each other. For example, the third connection structure 113 may function to serve as an organic interconnect bridge. The third connection structure 113 may also be disposed in a one-to-many relationship with the second semiconductor chip 122 for convenience of alignment. For example, one third connection structure 113 may be disposed corresponding to the two second semiconductor chips 122. The third connection structure 113 may include a third insulation layer 113*a*, a plurality of third redistribution layers 113*b* disposed on or in the third insulation layer 113*a*, and a plurality of third connection vias 113*c* disposed in the third insulation layer 113*a* and electrically connecting the plurality of third redistribution layers 113*b* to each other. The third insulation layer 113*a* may have a multilayer structure. The number of layers of the third insulation layer 113*a* and of the third redistribution layer 113*b*, and the number of vias of the third connection via 113*c*, are not particularly limited, and may vary depending on the design.

As the material of the third insulation layer 113*a*, an insulating material may be used. As the insulating material, a photosensitive insulating material such as PID may be used. For example, the third insulation layer 113*a* may be a photosensitive insulation layer. When the third insulation layer 113*a* has photosensitive property, the third insulation layer 113*a* may be relatively thinner, and the third insulation layer 113*a* more easily achieve the fine pitch of the third redistribution layer 113*b* and the third connection via 113*c*. The third insulation layer 113*a* may be a positive-type photosensitive insulation layer formed in a liquid type as described above. The third connection structure 113 may also be an organic block including the organic material. The third insulation layer 113*a* may be seen as a multilayer structure in which boundaries of the respective layers may be distinct, and may be seen as one layer in which boundaries of the respective layers may be unclear. A lowermost surface of the third insulation layer 113a may be coplanar with a lowermost surface of the passivation layer 115.

The third redistribution layer 113b may function to electrically connect the first and second connection pads 121P and 122P to each other, and, as a material for formation thereof, a metal material such as copper (Cu), aluminum (Al), silver (Ag), tin (Sn), gold (Au), nickel (Ni), lead (Pb), titanium (Ti), or alloys thereof may be used. The third redistribution layer 113b may perform various functions, depending on a desired design. For example, a ground pattern, a power pattern, a signal pattern, and the like may be included. The ground pattern and the power pattern may be the same pattern. The signal pattern may include various signal patterns except for a ground pattern, a power pattern, and the like, for example, a data signal pattern. A variety of connection via pads, electrical connection metal pads, and the like may be also included. The lowermost surface of the third redistribution layer 113b may be exposed from the lowermost surface of the third insulation layer 113a to use as a pad for connection with the first electrical connection metal 160. A surface treatment layer (not illustrated) may be formed on the surface of the pad pattern for the first electrical connection metal 160 on the lowermost surface of the third redistribution layer 113b, and the surface treatment layer (not illustrated) may be plated with nickel (Ni)/gold (Au) or the like.

The third connection via 113c may electrically connect the third redistribution layers 113b disposed in different layers, thereby forming an electrical path. As the material for forming the third connection via 113c, a metal material, such as copper (Cu), aluminum (Al), silver (Ag), tin (Sn), gold (Au), nickel (Ni), lead (Pb), titanium (Ti), or alloys thereof may be used. The third connection via 113c may be a filled type via filled with a metal material, or may be a conformal type via in which a metal material is formed along a wall surface of a via hole. Further, it may have a tapered shape in which a width of an upper surface thereof is wider than a width of a lower surface thereof. The third connection via 113c may have a signal via, a ground via, a power via, etc., and the ground via and power via may be the same vias.

The passivation layer 115 may protect the plurality of connection structures 111, 112, and 113 by embedding the plurality of connection structures 111, 112, and 113, and may play a role of fixing the plurality of connection structures 111, 112, and 113. The passivation layer 115 may include an insulating material. The insulating material may include a photosensitive insulating material. In this case, the under bump metal 114 may be more easily formed in a fine pitch. The passivation layer 115 may be a negative-type photosensitive insulation layer formed in a dry film. In this case, as described above, the plurality of connection structures 111, 112, and 113 may be easily covered with a relatively large area, and voids or the like between the plurality of connection structures 111, 112, and 113 may be minimized.

The under bump metal 114 may include a metal pad 114a disposed on the passivation layer 115, and a metal via 114b passing through the passivation layer 115 and electrically connected to the plurality of redistribution layers 111b, 112b, and 113b. The under bump metal 114 may compensate for misalignment of the plurality of redistribution layers 111b, 112b, and 113b, and the plurality of first and second connection pads 121P and 122P, which may occur during embedding of the plurality of connection structures 111, 112, and 113, and may electrically connect them. Accordingly, although the plurality of connection structures 111, 112, and 113 are separately manufactured, and then embedded in the passivation layer 115 to form the interposer 110 as described above, the misalignment may be effectively solved.

The metal pad 114a may provide an area in contact with the connection member 140. As a material for forming the metal pad 114a, a metal material such as copper (Cu), aluminum (Al), silver (Ag), tin (Sn), gold (Au), nickel (Ni), lead (Pb), titanium (Ti), or alloys thereof may be used. The metal pad 114a may include, for example, a ground pad, a power pad, a signal pad, and the like. The ground pad and the power pad may be the same pad. A surface treatment layer (not illustrated) may be formed on the surface of each of the metal pads 114a, and a surface treatment layer (not illustrated) may be plated with nickel (Ni)/gold (Au) or the like.

The metal via 114b may provide an electrical path between the metal pad 114a and the plurality of redistribution layers 111b, 112b, and 113b by passing through an area of the passivation layer 115 covering the plurality of connection structures 111, 112, and 113. As the material for forming the metal via 114b, a metal material, such as copper (Cu), aluminum (Al), silver (Ag), tin (Sn), gold (Au), nickel (Ni), lead (Pb), titanium (Ti), or alloys thereof may be used. The metal via 114b may be a filled type via filled with a metal material, or may be a conformal type via in which a metal material formed along a wall surface of a via hole. Further, it may have a tapered shape in which a width of an upper surface thereof is wider than a width of a lower surface thereof, in a similar manner to the first to third connection vias 111c, 112c, and 113c. The metal via 114b may have a signal via, a ground via, a power via, etc., and the ground via and power via may be the same vias.

The first semiconductor chip 121 may be in the form of an integrated circuit (IC) in which hundreds to millions of devices are integrated into one chip. In this case, silicon (Si), germanium (Ge), gallium arsenide (GaAs), or the like may be used as a base material of a body. The body may have various circuits formed therein. The first connection pad 121P of the first semiconductor chip 121 may be for electrically connecting the first semiconductor chip 121 to other components, and may be formed of copper (Cu), aluminum (Al), or the like without any particular limitation. A passivation film (not illustrated) may be formed on the body to expose the first connection pad 121P. The passivation film (not illustrated) may be an oxide film, a nitride film, or a double layer of the oxide film and the nitride film. An insulation film (not illustrated) or the like may be further disposed in other appropriate position(s) wherein insulation is to be provided. A first metal bump 121B in contact with the connection member 140 may be disposed on the first connection pad 121P. The first metal bump 121B may include a metal material such as copper (Cu), and the like.

The second semiconductor chip 122 may also be in the form of an integrated circuit (IC) in which hundreds to millions of devices are integrated into one chip. The second semiconductor chip 122 may be formed by stacking a plurality of such integrated circuits (IC). The stacked integrated circuits (IC) may be electrically connected to each other through a through-silicon via (TSV) or the like. The second semiconductor chip 122 may also have a second connection pad 122P for electrically connecting the second semiconductor chip 122 to another component. In this case, it can be understood that the second connection pad 122P is disposed on a lowermost surface of the second semiconductor chip 122, facing the interposer 110. A second metal bump 122B in contact with the connection member 140 may be disposed on the second connection pad 122P, and the second metal bump 122B may include a metal material such as copper (Cu), and the like.

The first semiconductor chip 121 may be an application specific integrated circuit (ASIC) such as a graphics processing unit (GPU). The second semiconductor chip 122 may be a stacked memory such as a high bandwidth memory (HBM). For example, the first and second semiconductor chips 121 and 122 may be expensive chips each having tens to millions of I/Os, but is not limited thereto. The second semiconductor chips 122 may be arranged in a larger number than the first semiconductor chips 121, and may be disposed around the first semiconductor chips 121, respectively. For example, two second semiconductor chips 122 may be disposed on opposing sides of the first semiconductor chip 121.

The encapsulant 130 may protect the first and second semiconductor chips 121 and 122. A form of the encapsulant 130 is not particularly limited, and may be any shape that covers at least a portion of each of the first and second semiconductor chips 121 and 122. The encapsulant 130 may also be in the form or shape to wrap or extend around the underfill resin 150 as well. For example, the encapsulant 130 may cover at least a portion of the side surfaces of each of the first and second semiconductor chips 121 and 122 and at least a portion of the side surface of the underfill resin 150. The encapsulant 130 may include an insulating material. Examples of the insulating material may include a thermosetting resin such as an epoxy resin, a thermoplastic resin such as polyimide, or a resin including a thermosetting resin or a thermoplastic resin as well as a reinforcing material such as an inorganic filler, specifically ABF, FR-4, BT resin, etc. In addition, a photo imageable encapsulant (PIE) may be used as needed. Alternatively, a material in which inorganic fillers are impregnated in the insulating resin such as a thermosetting resin or a thermoplastic resin, for example, a prepreg, or the like may be used. Optionally, the back surface of each of the first and second semiconductor chips 121 and 122 and the back surface of the encapsulant 130 may be made coplanar with each other through a grinding process. As above, when the first and second semiconductor chips 121 and 122 are exposed, the heat dissipation effect may be improved.

The connection member 140 may connect the respective under bump metal 114 to the first and second connection pads 121P and 122P, more specifically to the first and second metal bumps 121B and 122B, thereby forming an electrical path. The connection member 140 may include a low melting metal selected from the group consisting of tin (Sn), and alloys containing tin (Sn), and, may be, for example a solder bump. For example, the first and second semiconductor chips 121 and 122 may be surface-mounted on the interposer 110 using the plurality of under bump metals 114 and the plurality of connection members 140.

The underfill resin 150 may fix the first and second semiconductor chips 121 and 122 surface-mounted on the interposer 110, and may also protect them by covering at least a portion of each of the plurality of under bump metals 114, the plurality of connection members 140, and the plurality of first and second metal bumps 121B and 122B between the first and second semiconductor chips 121 and 122, and the interposer 110. The material of the underfill resin 150 is not particularly limited, and an insulating material having an adhesive property such as an epoxy resin may be used.

The underfill resin 150 may be introduced in a plurality of shapes corresponding to the first and second semiconductor chips 121 and 122, and the first and second semiconductor chips 121 and 122 may also be introduced in a single form to be fixed at one time.

The first electrical connection metal 160 may physically and/or electrically connect the semiconductor package 100 externally. For example, the semiconductor package 100 may be mounted on a BGA substrate or the like through the first electrical connection metal 160. The first electrical connection metal 160 may be formed of the above-described low melting point metal, for example, a solder, but this may be merely an example, and the material is not particularly limited thereto. The first electrical connection metal 160 may be a land, a solder ball, a pin, or the like. The first electrical connection metal 160 may be formed as a multi-layer or a single layer. In a case of being formed of multiple layers, it may include a copper pillar and a solder. In a case of being formed of a single layer, tin-silver solder or copper may be included, but this may be merely an example and is not limited thereto. The number, interval, arrangement type, etc., of the first electrical connection metal 160 are not particularly limited, and may be sufficiently modified, depending on a design specification by a skilled artisan. For example, the number of first electrical connection metal 160 may be in the range of tens to thousands, depending on the number of first and second connection pads 121P and 122P, and may be more or less than the above range.

A printed circuit board 200 may be disposed on a lower side of the interposer 110 of the semiconductor package 100, and the printed circuit board 200 may be connected to the first electrical connection metal 160. For example, the semiconductor package 100 may be surface-mounted on the printed circuit board 200 through the first electrical connection metal 160. The printed circuit board 200 may be mounted on the main board of the electronic device via the second electrical connection metal 210. The printed circuit board 200 may be a BGA substrate, but is not limited thereto.

The semiconductor package 100 with the printed circuit board 200 and/or the second electrical connection metal 210 disposed may be manufactured. For example, the semiconductor package 100 may include the printed circuit board 200 and/or the second electrical connection metal 210.

Figure 9:
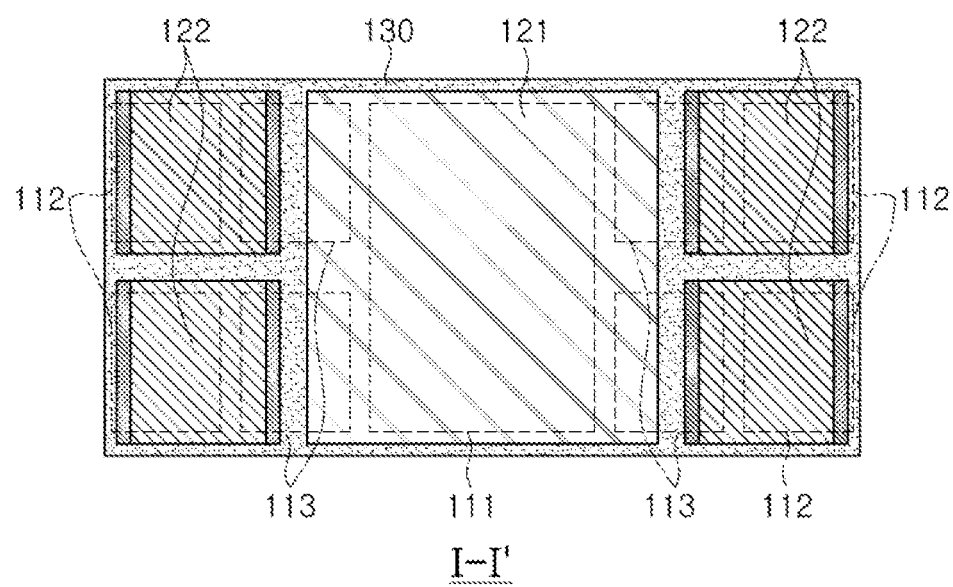
FIG. 9 is a cross-sectional view of another semiconductor package, taken along line I-I' of FIG. 6.

FIG. 9 is a schematic modified plan view illustrating another example of a semiconductor package, taken along line I-I' of FIG. 6.

Referring to the drawings, the number of second and third connection structures 112 and 113 may be further divided, depending on the number of second semiconductor chips 122, respectively. For example, the second and third connection structures 112 and 113 may be formed in the same number as the number of the second semiconductor chips 122, and then embedded in an interposer 110, respectively. As described above, a semiconductor package 100 according to the example may be manufactured by separating the second and third connection structures 112 and 113 to conform their process abilities; selecting only good components therefrom through electrical inspection to separate them from each other by a singulation process in a unit; and arranging them corresponding to the positions of the second semiconductor chips 122. Therefore, process difficulty may be relatively reduced, and efficiency and yield in a process may be relatively increased. Optionally, only the second connection structure 112 may be further divided, and the third connection structure 113 may be configured as illustrated in FIG. 8. Alternatively, only the third connection structure 113 may be further divided, and the second connection structure 112 may be configured as illustrated in FIG. 8.

Figure 10:
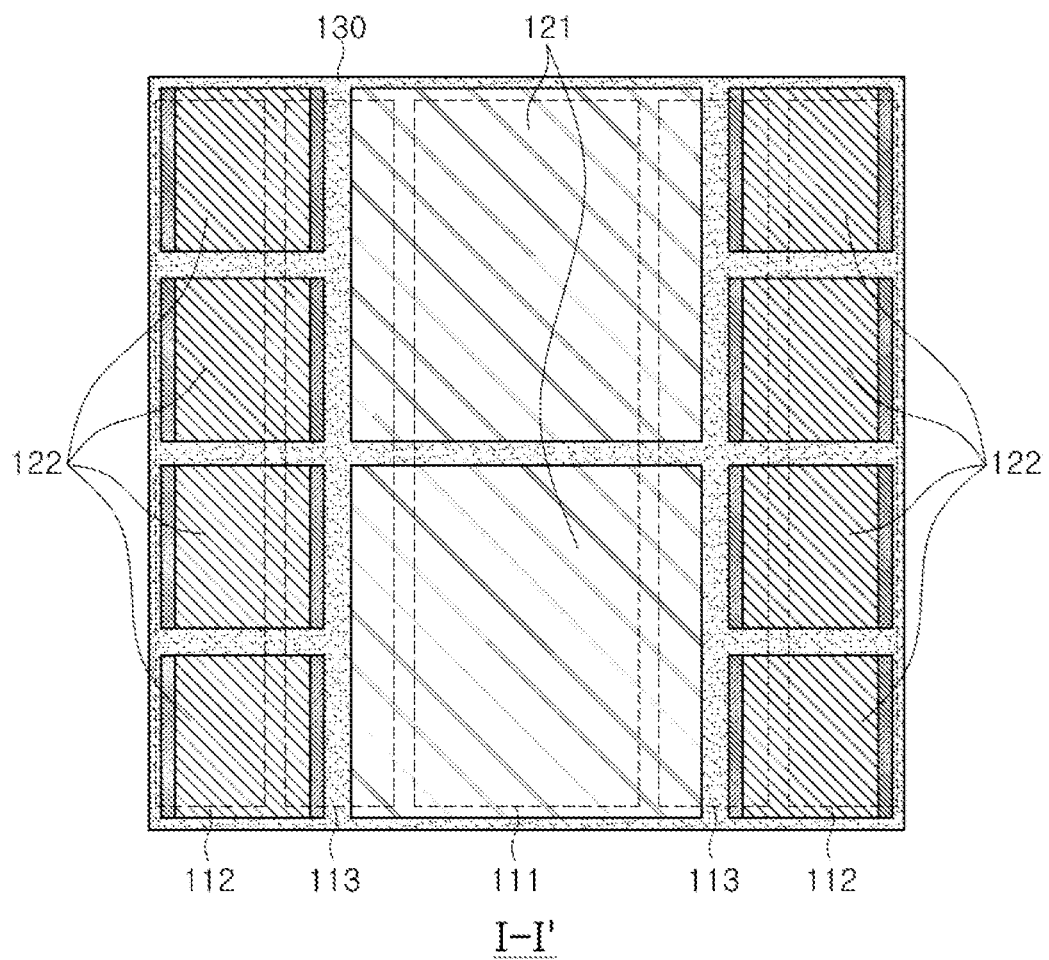
FIG. 10 is a cross-sectional view of another semiconductor package, taken along line I-I' of FIG. 6.

FIG. 10 is a schematic modified plan view illustrating another example of a semiconductor package taken along line I-I' of FIG. 6.

Referring to the drawings, a first semiconductor chips 121 may be arranged in a plurality, and a second semiconductor chips 122 may be arranged around first semiconductor chips 121 in a relatively large number. In this case, an interposer 110 may also be formed in a relatively large area. As described above, a semiconductor package 100 according to an example may lower process difficulty, increase efficiency and yield in process, and solve warpage or misalignment problem. Nevertheless, the interposer 110 having a relatively large area may be included. Therefore, the high quality of the set may easily be provided by the interposer 110.

Figure 11:
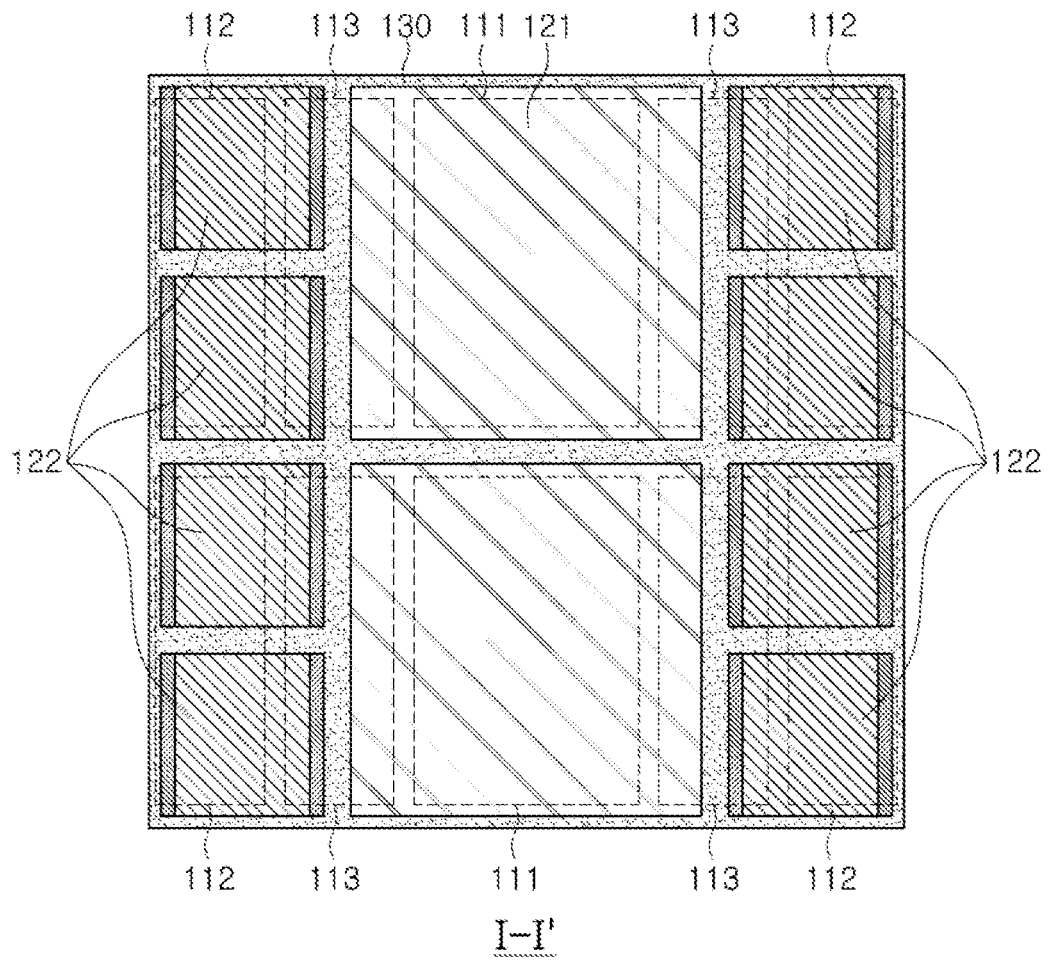
FIG. 11 is a cross-sectional view of another semiconductor package, taken along line I-I' of FIG. 6.

FIG. 11 is a schematic modified plan view illustrating another example of a semiconductor package taken along line I-I' of FIG. 6.

Referring to the drawings, when a plurality of first semiconductor chips 121 are arranged, and second semiconductor chips 122 in a relatively large number are also arranged around the first semiconductor chips 121, first to third connection structures 111, 112, and 113 may be further divided into a plurality of groups, respectively. For example, the first connection structure 111 may be divided into the same number as that of the first semiconductor chips 121, and the second and third connection structures 112 and 113 may be divided into a number of half the number of second semiconductor chip 122. By dividing the first to third connection structures 111, 112, and 113 in such a manner, the interposer 110 having a relatively large area may be manufactured with a relatively low processing difficulty, and as a result, efficiency and yield in process may be further increased. Optionally, only the first and second connection structures 111 and 112 may be further divided, and the third connection structure 113 may be configured as illustrated in FIG. 10. Alternatively, only the third connection structure 113 may be further divided, and the first and second connection structures 111 and 112 may be configured as illustrated in FIG. 10. Alternatively, only the first connection structure 111 may be further divided, and the second and third connection structures 112 and 113 may be configured as illustrated in FIG. 10.

Figure 12:
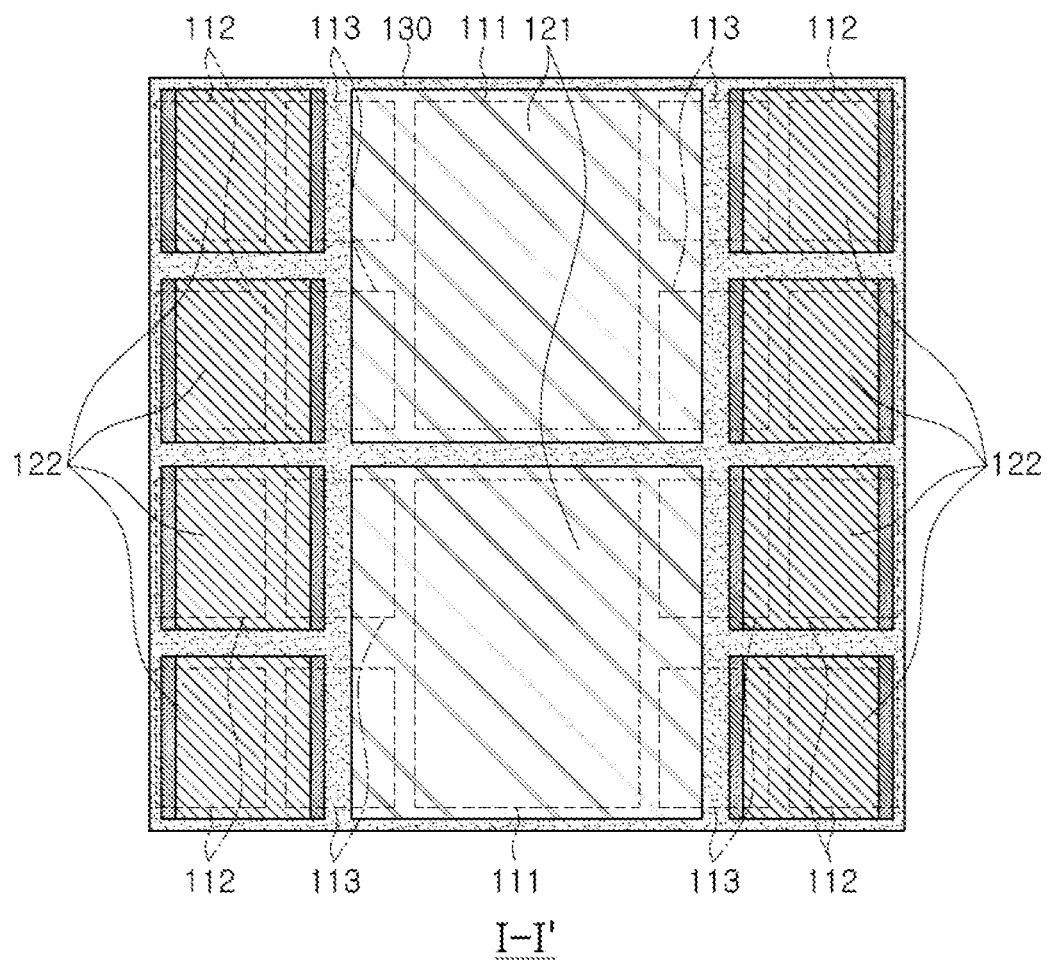
FIG. 12 is a cross-sectional view of another semiconductor package, taken along line I-I' of FIG. 6.

FIG. 12 is a schematic modified plan view illustrating another example of a semiconductor package taken along line I-I' of FIG. 6.

Referring to the drawings, when a plurality of first semiconductor chips 121 are arranged, and second semiconductor chips 122 in a relatively large number are also arranged around the first semiconductor chips 121, first to third connection structures 111, 112, and 113 may be further divided into a plurality of groups, respectively. For example, the first connection structure 111 may be divided into a number same as the number of first semiconductor chips 121, the second connection structure 112 and the third connection structure 113 may be divided into a number same as the number of the second semiconductor chips 122, respectively. By dividing the first to third connection structures 111, 112, and 113 in such a manner, the interposer 110 having a relatively large area may be manufactured with a relatively low processing difficulty, and as a result, efficiency and yield in process may be further increased. Optionally, only the first and second connection structures 111 and 112 may be further divided, and the third connection structure 113 may be configured as illustrated in FIG. 10 or 11.

Alternatively, only the third connection structure 113 may be further divided, and the first and second connection structures 111 and 112 may be configured as illustrated in FIG. 10 or 11. Alternatively, only the first connection structure 111 may be further divided, and the second and third connection structures 112 and 113 may be configured as illustrated in FIG. 10 or 11.

Figure 13:
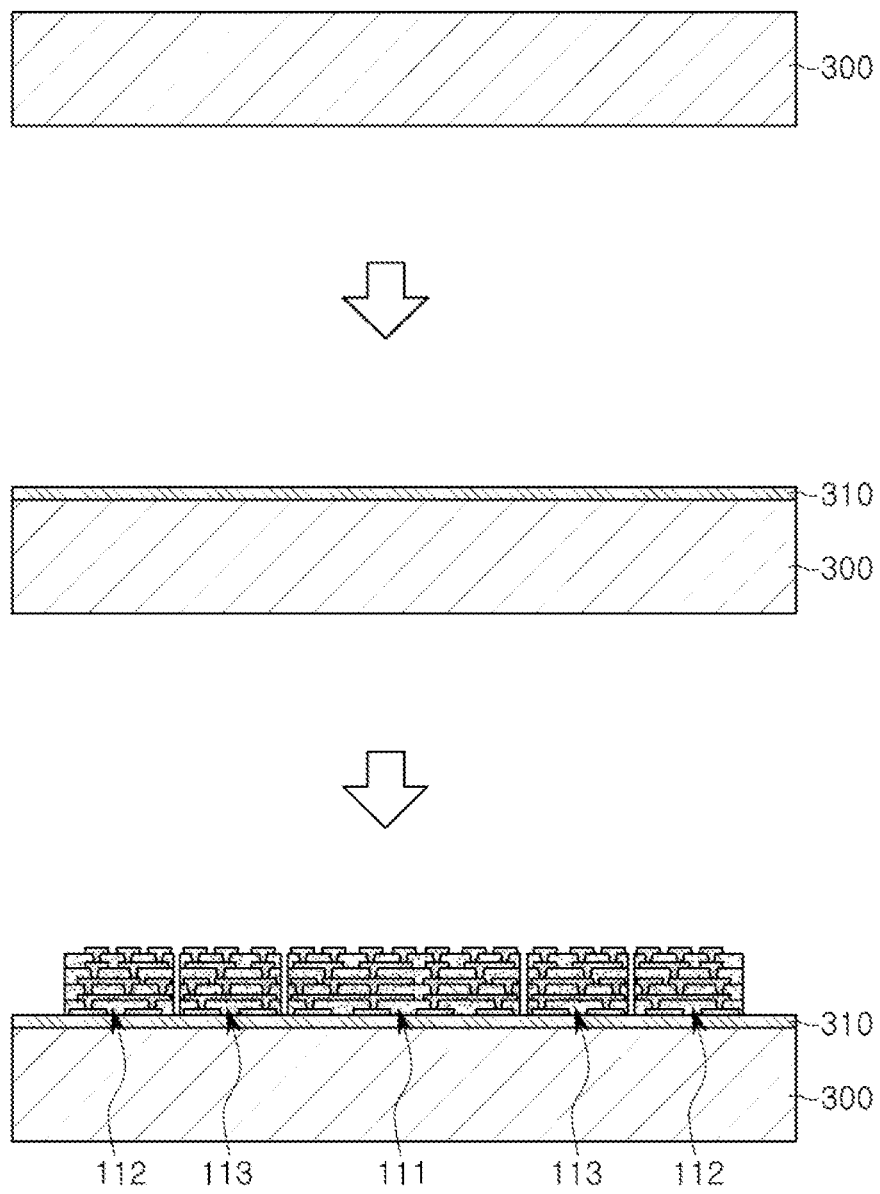
FIGS. 13 to 15 are schematic figures illustrating process steps of a method of manufacturing the semiconductor package of FIG. 6.
Figure 14:
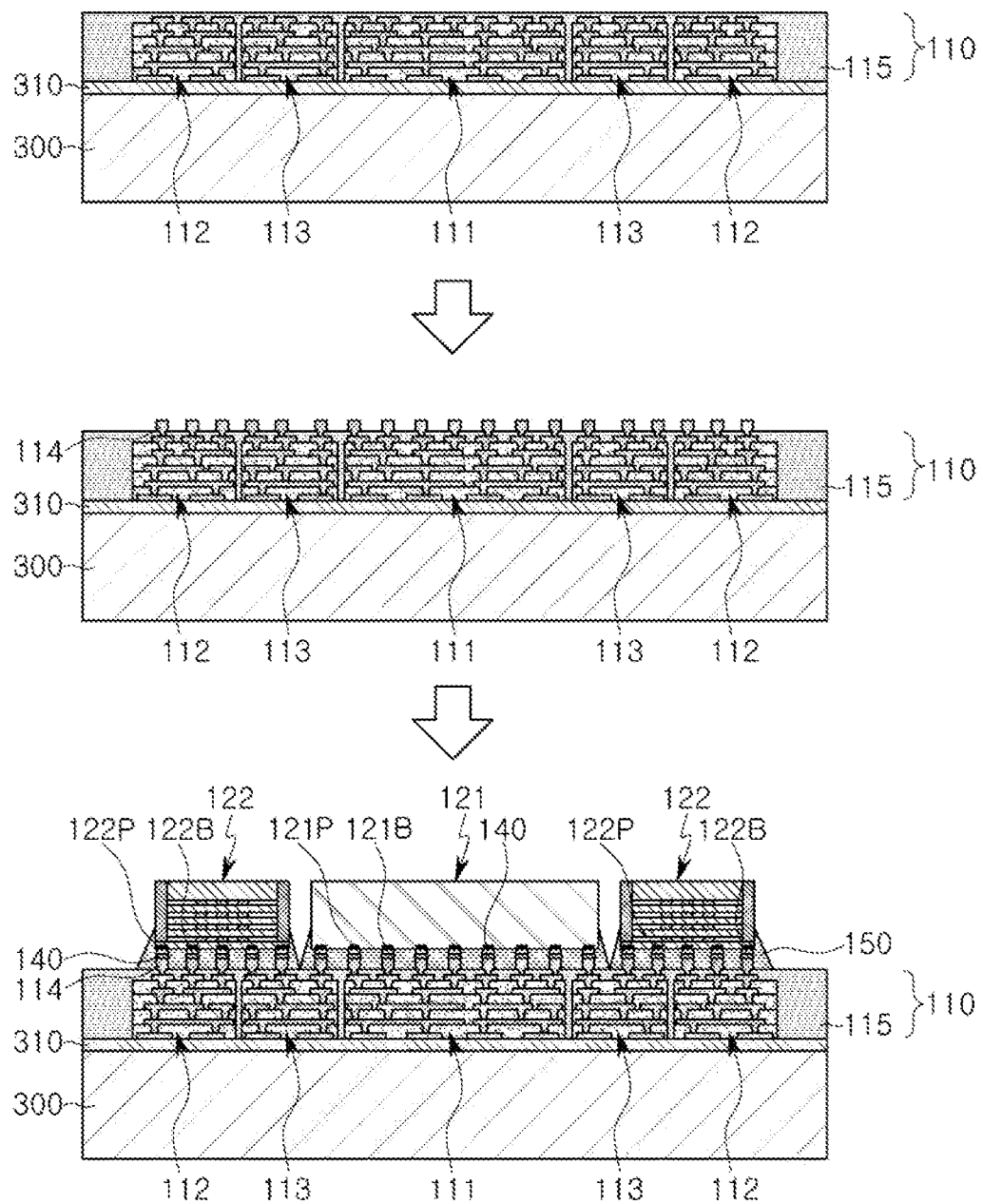
Figure 15:
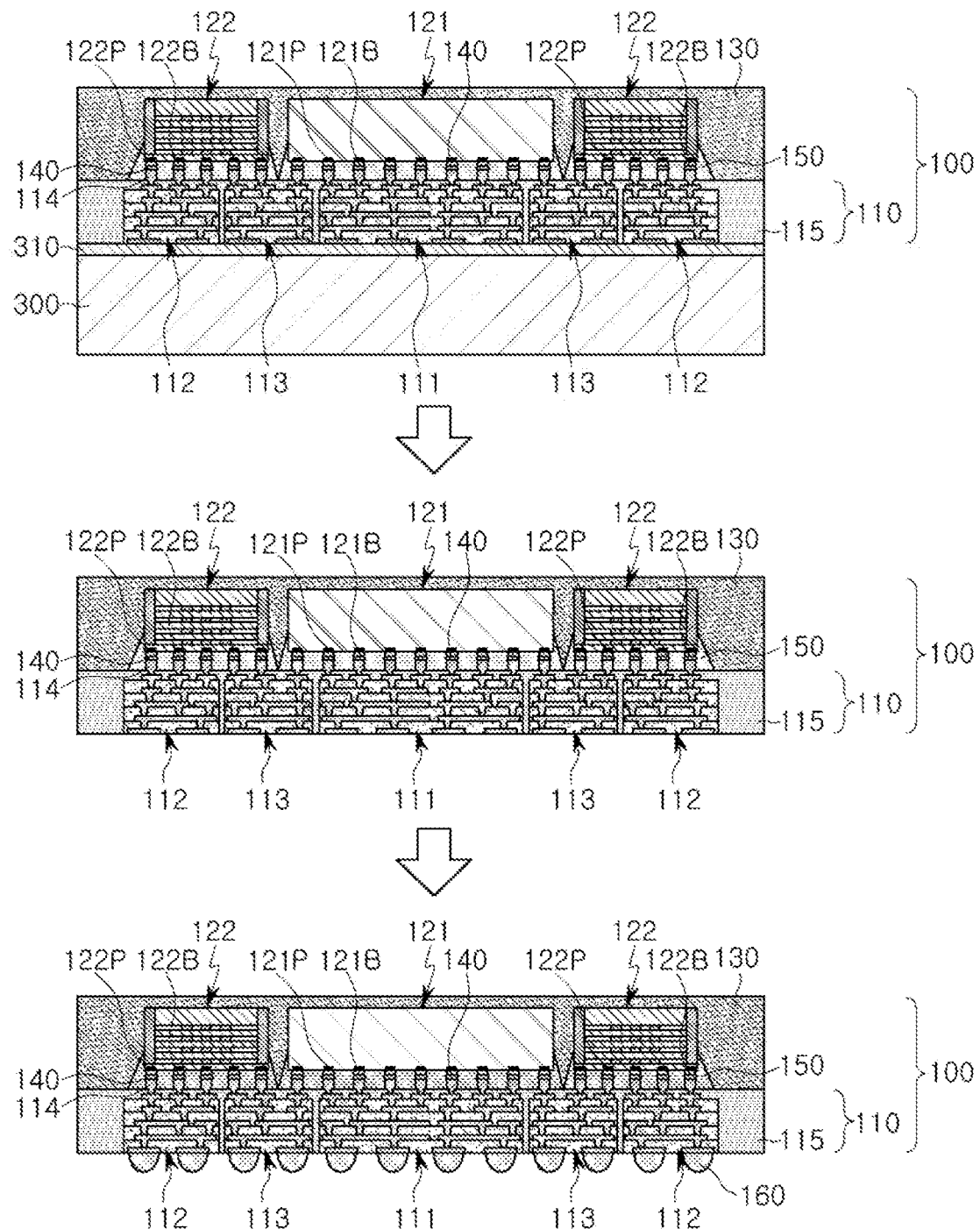

FIGS. 13 to 15 are schematic process diagrams illustrating sequential steps of an example process of manufacturing the semiconductor package of FIG. 6.

Referring to FIG. 13, first, a carrier 300 may be prepared. The carrier 300 may be a glass carrier. The present disclosure is not limited thereto, and may be, for example, a copper clad laminate (CCL). After the carrier 300 is prepared, an insulation layer 310 may be formed on the carrier 300. The insulation layer 310 may include an inorganic filler and an insulating resin. For example, the insulation layer 310 may include a thermosetting resin such as an epoxy resin, a thermoplastic resin such as polyimide, or a resin in which a thermosetting resin or a thermoplastic resin are mixed with an inorganic filler, for example, ABF (Ajinomoto Build-up Film), or the like. Next, a plurality of connection structures 111, 112, and 113 may be disposed on the insulation layer 310, respectively. Specifically, a plurality of connection structures 111, 112, and 113 having a difference in process difficulty may be separately manufactured by a plating process, a photolithography process, or the like, to conform their process abilities. Each of the connection structures 111, 112, and 113 may have a pad pattern that may be connected to the electrical connection metal on a lowermost surface thereof, and may have a pad pattern that may be connected to the under bump metal on an uppermost surface thereof. Only good components may be selected from the manufactured plurality of connection structures 111, 112, and 113 through electrical inspection to separate them from each other by a singulation process in a unit, to be attached to the insulation layer 310 to correspond to first and second semiconductor chips 121 and 122 on the insulation layer 310. An adhesive (not illustrated) may be used for the attachment. The adhesive (not illustrated) may be easily removed after a subsequent process, and a thermally stable material may be preferably used. For example, a liquid or film type adhesive maintaining relatively high temperature stability at 300 degrees or more may be applied.

Referring to FIG. 14, a passivation layer 115 may be formed on the insulation layer 310 to cover and fill spaces between the plurality of connection structures 111, 112, and 113. The passivation layer 115 may be formed by stacking a dry film and curing it. Next, at least a portion of an uppermost pad pattern of each of a plurality of redistribution layers 111b, 112b, and 113b may be exposed through the passivation layer 115 by a photolithography method or the like to form openings. Thereafter, a metal pad 114a and a metal via 114b may be formed on the respective openings by a plating method, such as, an additive process (AP), a semi-AP (SAP) process, a modified SAP (MSAP) process, a tenting process, and the like. Optionally, a surface treatment layer (not illustrated) may be formed on a surface of the metal pad 114a by using nickel (Ni)/gold (Au) or the like. Next, the first and second semiconductor chips 121 and 122 may be surface-mounted on an interposer 110 in such a manner that first and second metal bumps 121B and 122B on the first and second connection pads 121P and 122P of the first and second semiconductor chips 121 and 122 are connected to respective under bump metals of the plurality of under bump metals 114 by using a plurality of connection members 140. Thereafter, by filling a space between the first and second semiconductor chips 121 and 122 and the interposer 110 with an underfill resin 150, the first and second semiconductor chips 121 and 122 may be fixed and the plurality of first and second metal bumps 121B and 122B, the plurality of under bump metals 114, and the plurality of connection members 140 may be covered.

Referring to FIG. 15, an encapsulant 130 may be formed on the interposer 110 to cover and fill a space between the first and second semiconductor chips 121 and 122, the underfill resin 150, and the like. The encapsulant 130 may be formed by stacking a film-type ABF or the like, and curing it. Thereafter, back surfaces of the first and second semiconductor chips 121 and 122 may optionally be exposed from a back surface of the encapsulant 130 through a grinding process. Next, the carrier 300 and the insulation layer 310 may be separated and removed. Next, a plurality of first electrical connection metals 160 may be formed on lowermost pad patterns of the connection structures 111, 112, and 113 using a low melting point metal, such as solder, or the like. A surface treatment layer (not illustrated) may be formed on surfaces of the lowermost pad patterns of each of the connection structures 111, 112, and 113 by using nickel (Ni)/gold (Au) or the like. Thereafter, through a reflow process, a semiconductor package 100 according to the above-described example may be manufactured through a series of processes. Thereafter, the semiconductor package 100 may be surface-mounted on a printed circuit board 200 on which a second electrical connection metal 210 is formed via the first electrical connection metal 160, as needed.

In the present disclosure, the words lower, lower portion, lower surface, and the like are used to refer to the downward direction (in the vertical direction of the drawings, also referred to as the thickness direction) with respect to the cross section of the drawing for convenience, while the words upper, upper portion, upper surface, and the like are used to refer to a direction opposite thereto. It should be understood that, these directions are defined for convenience of explanation, the scope of the claims is not particularly limited by the description of such directions, and the concepts of the upward/downward directions may be changed at any time.

The term of "connect" or "connection" in the present disclosure may be not only a direct connection, but also a concept including an indirect connection through an adhesive layer or the like. In addition, the term "electrically connected" or "electrical connection" is a concept including both a physical connection and a physical non-connection. Also, the expressions of "first," second," etc. are used to distinguish one component from another, and do not limit the order and/or importance of the components. In some cases, without departing from the spirit of the present disclosure, the first component may be referred to as a second component, and similarly, the second component may be referred to as a first component.

The expression "an example embodiment" used in the present disclosure do not all refer to the same embodiment, but may be provided for emphasizing and explaining different unique features. However, the above-mentioned example embodiments do not exclude that they are implemented in combination with the features of other example embodiments. For example, although the description in the specific example embodiment may be not described in another example embodiment, it may be understood as an explanation related to another example embodiment, unless otherwise described or contradicted by the other example embodiment.

The terms used in the present disclosure are used only to illustrate an example embodiment, and are not intended to limit the present disclosure. At this time, the singular expressions include plural expressions unless the context clearly dictates otherwise.

According to an aspect of the present disclosure, a semiconductor package is provided that is capable of lowering manufacturing process difficulty, increasing efficiency and yield in process, and solving warpage or misalignment problems, while still being capable of including an interposer having a relatively large area.

While examples have been illustrated and described above, it will be apparent to those skilled in the art that modifications and variations could be made without departing from the scope of the present disclosure as defined by the appended claims.

What is claimed is:

1. A semiconductor package comprising:
an interposer including a first connection structure having a first redistribution conductor, a plurality of second connection structures each having a second redistribution conductor and disposed around the first connection structure, a plurality of third connection structures each having a third redistribution conductor and disposed between the first connection structure and the plurality of second connection structures, and a passivation layer filling spaces between the first connection structure, the plurality of second connection structures, and the plurality of third connection structures;
a first semiconductor chip disposed on the interposer to overlap the first connection structure and at least a portion of the plurality of third connection structures, in a stacking direction of the first semiconductor chip on the interposer;
a second semiconductor chip disposed on the interposer to overlap at least a portion of the plurality of second connection structures and at least a portion of the plurality of third connection structures, in a stacking direction of the second semiconductor chip on the interposer; and
a plurality of electrical connection structures disposed below the interposer, and electrically connected to the first semiconductor chip and the second semiconductor chip,
wherein the first redistribution conductor electrically connects the first semiconductor chip to at least a portion of the plurality of electrical connection structures,
the second redistribution conductor electrically connects the second semiconductor chip to at least a portion of the plurality of electrical connection structures, and
the third redistribution conductor electrically connects the first semiconductor chip and the second semiconductor chip to each other,
wherein each of the first connection structure, the plurality of second connection structures, and the plurality of third connection structures further includes a plurality of insulation layers,
wherein each of the first redistribution conductor, the second redistribution conductor, and the third redistribution conductor includes a plurality of redistribution layers disposed in or on the plurality of insulation layers, and a plurality of connection vias penetrating each of the plurality of insulation layers and electrically connecting the plurality of redistribution layers to each other, wherein the passivation layer and each of the plurality of insulation layers includes a photosensitive insulation layer, wherein each of the plurality of insulation layers is a positive-type photosensitive insulation layer, and wherein the passivation layer is a negative-type photosensitive insulation layer.

2. The semiconductor package of claim 1, wherein the first connection structure has a first side and a second side opposing each other, the plurality of second connection structures includes a first group of second connection structure disposed adjacent to the first side, and a second group of second connection structure disposed adjacent to the second side.

3. The semiconductor package of claim 2, wherein the first group of second connection structure and the second group of second connection structure include an equal number of second connection structure.

4. The semiconductor package of claim 2, wherein the plurality of third connection structures includes a first group of third connection structure disposed between the first group of second connection structure and the first side, and a second group of third connection structure disposed between the second group of second connection structure and the second side.

5. The semiconductor package of claim 4, wherein the first group of third connection structure and the second group of third connection structure include an equal number of third connection structure.

6. The semiconductor package of claim 1, wherein the plurality of redistribution layers of each of the first to third redistribution conductors have an equal number of layers.

7. The semiconductor package of claim 1, wherein the first to third connection structures have a thickness substantially the same as each other.

8. The semiconductor package of claim 1, wherein the first semiconductor chip includes a graphics processing unit (GPU), and the second semiconductor chip includes a high bandwidth memory (HBM).

9. The semiconductor package of claim 1, wherein the second semiconductor chip is provided with a plurality of second semiconductor chips disposed adjacent to the first semiconductor chip.

10. A semiconductor package comprising:

an interposer including a first connection structure having a first redistribution conductor, a second connection structure having a second redistribution conductor, and a third connection structure disposed between the first connection structure and the second connection structure, the third connection structure having a third redistribution conductor, the first to third connection structures being spaced apart from each other;

a first semiconductor chip disposed on the first connection structure and the third connection structure;

a second semiconductor chip disposed on the second connection structure and the third connection structure;

an encapsulant disposed on the interposer and covering each of the first semiconductor chip and the second semiconductor chip; and a plurality of electrical connection structures disposed below the interposer, and electrically connected to the first semiconductor chip and the second semiconductor chip, wherein the first redistribution conductor electrically connects the first semiconductor chip to at least a portion of the plurality of electrical connection structures, the second redistribution conductor electrically connects the second semiconductor chip to at least a portion of the plurality of electrical connection structures, the third redistribution conductor electrically connects the first semiconductor chip and the second semiconductor chip to each other the interposer further includes a passivation layer filling spaces between the first connection structure, the second connection structure, and the third connection structure, and a side surface of the passivation layer is coplanar with a side surface of the encapsulant, wherein each of the first connection structure, the second connection structure, and the third connection structure further includes a plurality of insulation layers, wherein each of the first redistribution conductor, the second redistribution conductor, and the third redistribution conductor includes a plurality of redistribution layers disposed in or on the plurality of insulation layers, and a plurality of connection vias penetrating each of the plurality of insulation layers and electrically connecting the plurality of redistribution layers to each other, wherein the passivation layer and each of the plurality of insulation layers includes a photosensitive insulation layer, wherein each of the plurality of insulation layers is a positive-type photosensitive insulation layer, and wherein the passivation layer is a negative-type photosensitive insulation layer.

11. The semiconductor package of claim 10, wherein each of the first connection structure, the second connection structure and the third connection structure is provided in plural, and a number of each of the second connection structures and the third connection structures is larger than a number of the first connection structures.

12. The semiconductor package of claim 10, wherein the first to third redistribution conductors are electrically insulated from each other.

13. The semiconductor package of claim 10, further comprising a plurality of connection members electrically connecting the first semiconductor chip and the second semiconductor chip to the first redistribution conductor, the second redistribution conductor, and the third redistribution conductor.

14. The semiconductor package of claim 13, wherein the plurality of connection members comprise a low melting point metal selected from a group consisting of tin (Sn), and alloys containing tin (Sn).

15. The semiconductor package of claim 10, wherein each of the first semiconductor chip and the second semiconductor chip is provided in plural and a number of the second semiconductor chips is larger than a number of the first semiconductor chips.

16. A semiconductor package comprising:

a printed circuit board;

an interposer disposed on the printed circuit board, and including a first connection structure having a first redistribution conductor, a second connection structure having a second redistribution conductor, and a third connection structure disposed between the first connection structure and the second connection structure, the third connection structure having a third redistribution conductor;

a first semiconductor chip disposed on the interposer to overlap the first connection structure and the third connection structure, in a stacking direction of the first semiconductor chip on the interposer;

a second semiconductor chip disposed on the interposer to overlap the second connection structure and the third connection structure, in a stacking direction of the second semiconductor chip on the interposer; and an encapsulant disposed on the interposer and covering each of the first semiconductor chip and the second semiconductor chip, wherein the first redistribution conductor redistributes the first semiconductor chip, the second redistribution conductor redistributes the second semiconductor chip, the third redistribution conductor electrically connects the first semiconductor chip and the second semiconductor chip to each other, the interposer further includes a passivation layer filling spaces between the first connection structure, the second connection structure, and the third connection structure, and a side surface of the passivation layer is coplanar with a side surface of the encapsulant, wherein each of the first connection structure, the second connection structure, and the third connection structure further includes a plurality of insulation layers, wherein each of the first redistribution conductor, the second redistribution conductor, and the third redistribution conductor includes a plurality of redistribution layers disposed in or on the plurality of insulation layers, and a plurality of connection vias penetrating each of the plurality of insulation layers and electrically connecting the plurality of redistribution layers to each other, wherein the passivation layer and each of the plurality of insulation layers includes a photosensitive insulation layer, wherein each of the plurality of insulation layers is a positive-type photosensitive insulation layer, and wherein the passivation layer is a negative-type photosensitive insulation layer.

\* \* \* \* \*